US008304863B2

(12) United States Patent
Filippi et al.

(10) Patent No.: US 8,304,863 B2
(45) Date of Patent: Nov. 6, 2012

(54) ELECTROMIGRATION IMMUNE THROUGH-SUBSTRATE VIAS

(75) Inventors: Ronald G. Filippi, Hopewell Junction, NY (US); John A. Fitzsimmons, Hopewell Junction, NY (US); Kevin Kolvenbach, Hopewell Junction, NY (US); Ping-Chuan Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 228 days.

(21) Appl. No.: 12/702,463

(22) Filed: Feb. 9, 2010

(65) Prior Publication Data

US 2011/0193199 A1 Aug. 11, 2011

(51) Int. Cl.
*H01L 29/40* (2006.01)

(52) U.S. Cl. ........... 257/621; 257/751; 257/E23.011; 257/E21.499; 438/106; 438/107; 438/120; 438/123

(58) Field of Classification Search .......... 438/629, 438/637–639, 653
See application file for complete search history.

(56) References Cited

U.S. PATENT DOCUMENTS

| | | | | |
|---|---|---|---|---|
| 5,091,339 A * | 2/1992 | Carey | .............................. | 216/18 |
| 5,108,785 A * | 4/1992 | Lincoln et al. | ................ | 427/555 |
| 5,247,196 A * | 9/1993 | Kimura | ......................... | 257/303 |
| 5,313,100 A * | 5/1994 | Ishii et al. | ...................... | 257/751 |
| 5,439,731 A | 8/1995 | Li et al. | | |
| 5,585,674 A | 12/1996 | Geffken et al. | | |
| 5,619,008 A * | 4/1997 | Chawla et al. | ................. | 102/310 |
| 5,719,085 A * | 2/1998 | Moon et al. | .................... | 438/424 |
| 5,902,118 A * | 5/1999 | Hubner | ......................... | 438/106 |
| 5,915,167 A | 6/1999 | Leedy | | |
| 5,929,524 A * | 7/1999 | Drynan et al. | ................. | 257/758 |
| 5,930,667 A | 7/1999 | Oda | | |
| 5,956,843 A * | 9/1999 | Mizumoto et al. | ............. | 29/852 |
| 5,977,780 A * | 11/1999 | Herrmann | ..................... | 324/640 |
| 6,008,114 A * | 12/1999 | Li | ................................. | 438/618 |
| 6,132,853 A * | 10/2000 | Noddin | ........................ | 428/209 |
| 6,133,640 A | 10/2000 | Leedy | | |

(Continued)

FOREIGN PATENT DOCUMENTS

CN 1525485 4/1998

(Continued)

OTHER PUBLICATIONS

Blech, I. A., "Electromigration in Thin Aluminum Films on Titanium Nitride" Journal of Applied Physics (1976) pp. 1203-1208, vol. 47(4).

*Primary Examiner* — N Drew Richards
*Assistant Examiner* — Ankush Singal
(74) *Attorney, Agent, or Firm* — Scully, Scott, Murphy & Presser, P.C.; Katherine S. Brown, Esq.

(57) ABSTRACT

A through-substrate via (TSV) structure includes at least two electrically conductive via segments embedded in a substrate and separated from each other by an electrically conductive barrier layer therebetween. The length of each individual conductive via segment is typically equal to, or less than, the Blech length of the conductive material so that the stress-induced back flow force, generated by each conductive barrier layer, cancels the electromigration force in each conductive via segment. Consequently, the TSV structures are immune to electromigration, and provide reliable electrical connections among a chips stacked in 3 dimensions.

8 Claims, 12 Drawing Sheets

U.S. PATENT DOCUMENTS

| | | | | |
|---|---|---|---|---|
| 6,156,626 A * | 12/2000 | Bothra | | 438/470 |
| 6,208,545 B1 | 3/2001 | Leedy | | |
| 6,259,160 B1 | 7/2001 | Lopatin et al. | | |
| 6,369,446 B1 * | 4/2002 | Tanaka | | 257/758 |
| 6,376,353 B1 * | 4/2002 | Zhou et al. | | 438/612 |
| 6,383,920 B1 | 5/2002 | Wang et al. | | |
| 6,395,633 B1 * | 5/2002 | Cheng et al. | | 438/687 |
| 6,400,008 B1 * | 6/2002 | Farnworth | | 257/698 |
| 6,417,561 B1 * | 7/2002 | Tuttle | | 257/659 |
| 6,479,382 B1 * | 11/2002 | Naem | | 438/658 |
| 6,501,115 B2 * | 12/2002 | Yoshida et al. | | 257/296 |
| 6,501,177 B1 | 12/2002 | Lopatin et al. | | |
| 6,528,409 B1 | 3/2003 | Lopatin et al. | | |
| 6,531,377 B2 * | 3/2003 | Knorr et al. | | 438/435 |
| 6,551,857 B2 | 4/2003 | Leedy | | |
| 6,563,224 B2 | 5/2003 | Leedy | | |
| 6,583,051 B2 | 6/2003 | Lopatin et al. | | |
| 6,597,067 B1 | 7/2003 | Biery et al. | | |
| 6,599,778 B2 * | 7/2003 | Pogge et al. | | 438/118 |
| 6,632,706 B1 | 10/2003 | Leedy | | |
| 6,649,511 B1 | 11/2003 | Achuthan et al. | | |
| 6,713,872 B2 * | 3/2004 | Tanaka | | 257/758 |
| 6,806,578 B2 * | 10/2004 | Howell et al. | | 257/762 |
| 6,806,579 B2 * | 10/2004 | Cowley et al. | | 257/762 |
| 6,809,269 B2 * | 10/2004 | Fuller et al. | | 174/264 |
| 6,812,127 B2 | 11/2004 | Oshima et al. | | |
| 6,846,725 B2 * | 1/2005 | Nagarajan et al. | | 438/456 |
| 7,062,850 B2 | 6/2006 | Atakov et al. | | |
| 7,074,709 B2 * | 7/2006 | Young | | 438/625 |
| 7,078,352 B2 * | 7/2006 | Beyer et al. | | 438/739 |
| 7,115,973 B1 * | 10/2006 | Naem | | 257/621 |
| 7,138,295 B2 | 11/2006 | Leedy | | |
| 7,138,714 B2 * | 11/2006 | Nguyen et al. | | 257/751 |
| 7,193,239 B2 | 3/2007 | Leedy | | |
| 7,279,411 B2 * | 10/2007 | Agarwala et al. | | 438/618 |
| 7,294,897 B2 | 11/2007 | Akram et al. | | |
| 7,371,654 B2 * | 5/2008 | Sato et al. | | 438/424 |
| 7,439,624 B2 * | 10/2008 | Yang et al. | | 257/758 |
| 7,470,612 B2 * | 12/2008 | Choi et al. | | 438/627 |
| 7,474,004 B2 | 1/2009 | Leedy | | |
| 7,504,732 B2 | 3/2009 | Leedy | | |
| 7,534,696 B2 * | 5/2009 | Jahnes et al. | | 438/421 |
| 7,705,466 B2 | 4/2010 | Leedy | | |
| 7,754,561 B2 * | 7/2010 | Eun | | 438/221 |
| 7,767,493 B2 * | 8/2010 | Trezza et al. | | 438/108 |
| 7,795,735 B2 * | 9/2010 | Hsu et al. | | 257/758 |
| 7,808,111 B2 * | 10/2010 | Trezza | | 257/774 |
| 7,839,163 B2 * | 11/2010 | Feng et al. | | 326/38 |
| 7,872,351 B2 * | 1/2011 | Kim et al. | | 257/751 |
| 7,939,941 B2 * | 5/2011 | Chiou et al. | | 257/758 |
| 8,026,610 B2 * | 9/2011 | Murayama | | 257/773 |
| 2001/0000884 A1 * | 5/2001 | Miller et al. | | 174/259 |
| 2001/0006255 A1 * | 7/2001 | Kwon et al. | | 257/751 |
| 2001/0018230 A1 * | 8/2001 | Jimarez et al. | | 438/108 |
| 2002/0014698 A1 * | 2/2002 | Umemura | | 257/758 |
| 2002/0102840 A1 * | 8/2002 | Tsai et al. | | 438/638 |
| 2002/0130415 A1 * | 9/2002 | Hasunuma et al. | | 257/751 |
| 2002/0132465 A1 | 9/2002 | Leedy | | |
| 2002/0157864 A1 * | 10/2002 | Koyama et al. | | 174/261 |
| 2002/0182855 A1 * | 12/2002 | Agarwala et al. | | 438/638 |
| 2003/0173608 A1 | 9/2003 | Leedy | | |
| 2003/0184987 A1 * | 10/2003 | Coomer et al. | | 361/795 |
| 2004/0067638 A1 * | 4/2004 | Hau-Riege | | 438/629 |
| 2004/0201095 A1 * | 10/2004 | Palmer et al. | | 257/700 |
| 2005/0017369 A1 * | 1/2005 | Clayton et al. | | 257/774 |
| 2005/0139954 A1 * | 6/2005 | Pyo | | 257/531 |
| 2005/0186799 A1 * | 8/2005 | Wu et al. | | 438/692 |
| 2006/0121690 A1 * | 6/2006 | Pogge et al. | | 438/455 |
| 2006/0160354 A1 | 7/2006 | Zhang et al. | | |
| 2007/0057384 A1 * | 3/2007 | Alam et al. | | 257/783 |
| 2007/0205515 A1 * | 9/2007 | Agarwala et al. | | 257/758 |
| 2008/0073747 A1 * | 3/2008 | Chao et al. | | 257/520 |
| 2008/0081386 A1 | 4/2008 | Raravikar et al. | | |
| 2008/0093664 A1 * | 4/2008 | Yun et al. | | 257/324 |
| 2008/0206984 A1 * | 8/2008 | Sparks et al. | | 438/637 |
| 2008/0220565 A1 * | 9/2008 | Hsu et al. | | 438/109 |
| 2008/0233710 A1 * | 9/2008 | Hsu et al. | | 438/455 |
| 2008/0257591 A1 * | 10/2008 | Ikeda | | 174/255 |
| 2009/0014891 A1 * | 1/2009 | Chang et al. | | 257/777 |
| 2009/0039527 A1 * | 2/2009 | Chan et al. | | 257/777 |
| 2009/0067210 A1 | 3/2009 | Leedy | | |
| 2009/0130846 A1 * | 5/2009 | Mistuhashi | | 438/667 |
| 2009/0174082 A1 | 7/2009 | Leedy | | |
| 2009/0175104 A1 | 7/2009 | Leedy | | |
| 2009/0195125 A1 * | 8/2009 | Matsugi | | 310/348 |
| 2009/0218700 A1 | 9/2009 | Leedy | | |
| 2009/0219742 A1 | 9/2009 | Leedy | | |
| 2009/0219743 A1 | 9/2009 | Leedy | | |
| 2009/0219744 A1 | 9/2009 | Leedy | | |
| 2009/0219772 A1 | 9/2009 | Leedy | | |
| 2009/0230501 A1 | 9/2009 | Leedy | | |
| 2009/0242932 A1 * | 10/2009 | Luryi | | 257/184 |
| 2009/0283871 A1 * | 11/2009 | Chang et al. | | 257/621 |
| 2009/0283872 A1 * | 11/2009 | Lin et al. | | 257/621 |
| 2009/0321945 A1 * | 12/2009 | Besling | | 257/774 |
| 2010/0019310 A1 * | 1/2010 | Sakamoto | | 257/324 |
| 2010/0032811 A1 * | 2/2010 | Ding et al. | | 257/527 |
| 2010/0033273 A1 * | 2/2010 | Hanke et al. | | 333/81 A |
| 2010/0047963 A1 * | 2/2010 | Wang et al. | | 438/107 |
| 2010/0093143 A1 * | 4/2010 | Ide et al. | | 438/261 |
| 2010/0130003 A1 * | 5/2010 | Lin et al. | | 438/637 |
| 2010/0144094 A1 * | 6/2010 | Chen et al. | | 438/109 |
| 2010/0171224 A1 | 7/2010 | Leedy | | |
| 2010/0171225 A1 | 7/2010 | Leedy | | |
| 2010/0172197 A1 | 7/2010 | Leedy | | |
| 2010/0173453 A1 | 7/2010 | Leedy | | |
| 2010/0182040 A1 * | 7/2010 | Feng et al. | | 326/38 |
| 2010/0187670 A1 * | 7/2010 | Lin et al. | | 257/686 |
| 2010/0261318 A1 * | 10/2010 | Feng et al. | | 438/132 |
| 2010/0264551 A1 * | 10/2010 | Farooq et al. | | 257/777 |
| 2010/0297848 A1 * | 11/2010 | Breitwisch et al. | | 438/703 |
| 2010/0308435 A1 * | 12/2010 | Nowak et al. | | 257/532 |
| 2010/0327445 A1 * | 12/2010 | Filippi et al. | | 257/751 |
| 2011/0034021 A1 * | 2/2011 | Feng et al. | | 438/600 |
| 2011/0045669 A1 * | 2/2011 | Nakao et al. | | 438/653 |
| 2011/0074040 A1 * | 3/2011 | Frank et al. | | 257/774 |
| 2011/0121427 A1 * | 5/2011 | Stupar et al. | | 257/532 |
| 2011/0169135 A1 * | 7/2011 | Nakao | | 257/532 |
| 2011/0198609 A1 * | 8/2011 | Huang | | 257/76 |

FOREIGN PATENT DOCUMENTS

| | | |
|---|---|---|
| CN | 101188235 | 4/1998 |
| CN | 98803836 | 6/2004 |
| EP | 0975472 | 4/1998 |
| EP | 1986233 | 4/1998 |
| JP | 10-543031 | 4/1998 |
| JP | 2008028407 | 8/2007 |
| JP | 2008166831 | 7/2008 |
| JP | 2008166832 | 7/2008 |
| JP | 2008172254 | 7/2008 |
| KR | 10-0639752 | 10/2006 |
| KR | 10-0785821 | 12/2007 |
| TW | 412854 | 11/2000 |

* cited by examiner

ELECTROMIGRATION IMMUNE THROUGH-SUBSTRATE VIAS

BACKGROUND

The present invention relates to the field of semiconductor structures, and particularly to electromigration immune through-substrate vias and methods of manufacturing the same.

A metal structure includes a lattice of metal ions and non-localized free electrons. The metal ions are formed from metal atoms that donate some of their electrons to a common conduction band of the lattice, and the non-localized free electrons move with relatively small resistance within the lattice under an electric field. Normal metal lines, excluding superconducting materials at or below a superconducting temperature, have finite conductivity, which is caused by interaction of electrons with crystalline imperfections and phonons which are thermally induced lattice vibrations.

When electrical current flows in the metal line, the metal ions are subjected to an electrostatic force due to the charge of the metal ion and the electric field to which the metal ion is exposed to. Further, as electrons scatter off the lattice during conduction of electrical current, the electrons transfer momentum to the metal ions in the lattice of the conductor material. The direction of the electrostatic force is in the direction of the electric field, i.e., in the direction of the current, and the direction of the force due to the momentum transfer of the electrons is in the direction of the flow of the electrons, i.e., in the opposite direction of the current. However, the force due to the momentum transfer of the electrons is generally greater than the electrostatic force. Thus, metal ions are subjected to a net force in the opposite direction of the current, or in the direction of the flow of the electrons.

High defect density, i.e., smaller grain size of the metal, or high temperature typically increases electron scattering. The amount of momentum transfer from the electrons to the conductor material increases with electron scattering. Such momentum transfer, if performed sufficiently cumulatively, may cause the metal ions to dislodge from the lattice and move physically. The mass transport caused by the electrical current, or the movement of the conductive material due to electrical current, is termed electromigration in the art.

In applications where high direct current densities are used, such as in metal interconnects of semiconductor devices, electromigration causes a void in a metal line or in a metal via. Such a void results in a locally increased resistance in the metal interconnect, or even an outright circuit "open." In this case, the metal line or the metal via no longer provides a conductive path in the metal interconnect. Formation of voids in the metal line or the metal via can thus result in a product failure in semiconductor devices. Further, accumulation of electromigrated materials as extrusions or hillocks outside the volume of the original metal structures can result in electrical "shorts" with adjacent metal structures.

Electromigration is a function of current density and temperature, and accelerates at high current densities and high temperatures. In addition, electromigration is a function of the grain size and the geometry of the metal line. Specifically, the width of the metal line relative to the grain size can have a significant effect on electromigration. If the width of the metal line becomes smaller than the grain size itself, all grain boundaries are perpendicular to the current flow. Such a structure is also known as a "bamboo structure." Formation of a bamboo structure results in a longer path for mass transport, thereby reducing the atomic flux and electromigration failure rate.

Further, the length of the metal line can have a significant effect on electromigration. If the length of the metal line is less than a critical length known as the "Blech length," the metal line is immune to electromigration because the electromigration force is balanced by a stress-induced back-flow of atoms.

In recent years, "three dimensional silicon" (3DSi) structures have been proposed to enable joining of multiple silicon chips and/or wafers that are mounted on a package or a system board. The 3DSi structures increase the density of active circuits that are integrated in a given space. Such 3DSi structures employ through-substrate vias (TSVs) to provide electrical connection among the multiple silicon chips and/or wafers. The length of the TSVs is substantially equal to the thickness of each silicon chip or wafer. Because the thickness of silicon chips and wafers are on the order of 100 microns, the length of the TSVs exceeds the Blech length. See I. A. Blech, J. Appl. Phys. 47, 1203 (1976). Thus, the TSVs as known in the prior art are inherently subject to electromigration, and can fail during operation of the semiconductor chips.

BRIEF SUMMARY

A through-substrate via (TSV) structure is provided that includes at least two electrically conductive via segments embedded in a substrate. The at least two electrically conductive via segments are separated from each other by an electrically conductive barrier layer therebetween. The length of each individual conductive via segment is typically equal to, or less than, the Blech length of the conductive material so that the stress-induced back flow force, generated by each conductive barrier layer, cancels the electromigration force in each conductive via segment. Consequently, the TSV structures are immune to electromigration, and provide reliable electrical connections among chips stacked in 3 dimensions.

According to an aspect of the present invention, a semiconductor structure includes a first substrate. The first substrate includes at least one through-substrate via (TSV) structure extending from a first surface located on one side of the first substrate to a second surface located on an opposite side of the first substrate. Each of the at least one TSV structure includes a plurality of conductive via segments that are vertically spaced from one another by at least one conductive liner portion.

According to another aspect of the present invention, a method of forming a semiconductor structure is provided, which includes: forming at least one trench having substantially vertical sidewalls in a first substrate; filling the at least one trench with a conductive liner material and a conductive via segment material, wherein the conductive liner material constitutes a conductive liner located on sidewalls of the at least one trench and the conductive via segment material fills each cavity in the at least one trench; and performing at least once a set of processing steps. The set of processing steps may include: recessing a portion of a material that fills each upper portion of the at least one trench; depositing another conductive liner material on exposed sidewalls of each of the at least one trench; and depositing another conductive via segment material in each of the at least one trench. By performing the set of processing steps at least once, at least one through-substrate via (TSV) structure is formed in the first substrate.

DETAILED DESCRIPTION

Figure 1:
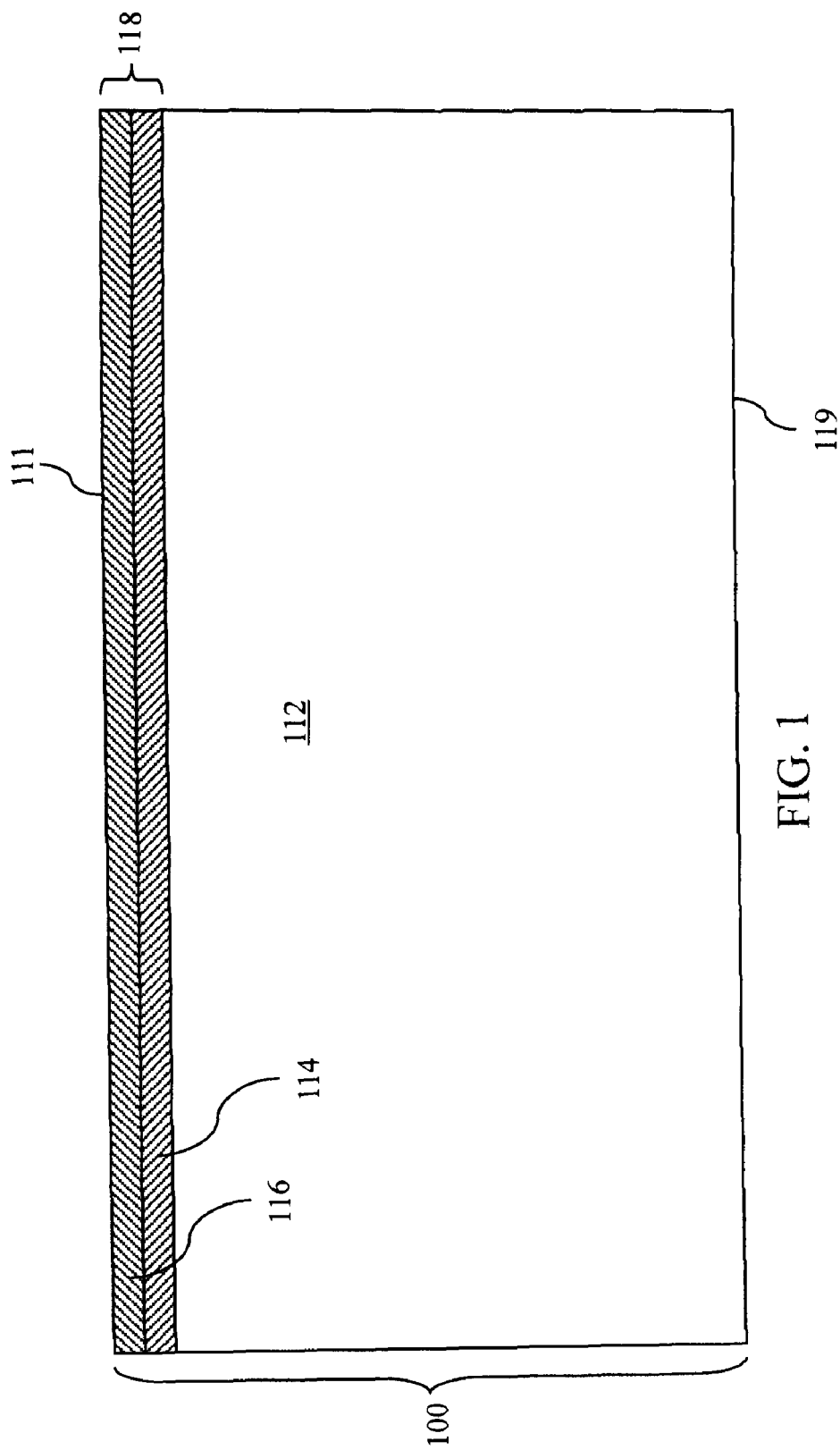
FIG. 1 is a vertical cross-sectional view of a first exemplary semiconductor structure before forming at least one trench in a first substrate according to a first embodiment of the present invention.

As stated above, the present invention relates to electromigration immune through-substrate vias and methods of manufacturing the same, which are now described in detail with accompanying figures. Throughout the drawings, the same reference numerals or letters are used to designate like or equivalent elements. The drawings are not necessarily drawn to scale.

As used herein, a "conductive through-substrate via (TSV) structure" is a conductive structure that extends through a substrate, i.e., at least from a top surface of the substrate to a bottom surface of the substrate.

As used herein, a surface is "substantially planar" if the surface is intended to be planar and the non-planarity of the surface is limited by imperfections inherent in the processing steps that are employed to form the surface.

As used herein, a "mounting structure" is any structure to which a semiconductor chip can be mounted by making electrical connections thereto. A mounting structure can be a packaging substrate, an interposer structure, or another semiconductor chip.

Referring to FIG. 1, a first exemplary semiconductor structure according to a first embodiment of the present invention includes a first substrate 100. The first substrate 100 can include a first handle substrate 112 and a first semiconductor-device-containing layer 118 that can include at least one semiconductor device such as a field effect transistor, a bipolar transistor, a diode, a thyristor, and a memory cell. The first semiconductor-device-containing layer 118 can include semiconductor devices for a semiconductor chip. The first substrate 100 typically has a first substantially planar surface 111 on one side and a second substantially planar surface 119 on an opposite side. The thickness of the first substrate 100 is typically from 100 microns to 1,000 microns, although lesser and greater thicknesses can also be employed.

A lower portion of the first semiconductor-device-containing layer 118 can include a semiconductor material layer 114. The semiconductor material layer 114 includes a semiconductor material that can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor material layer 114 can include a single crystalline material. For example, the semiconductor material layer 114 can be a single crystalline silicon layer. The semiconductor material layer 114 can be doped with dopants of a first conductivity type, which can be p-type or n-type. The dopant concentration of the semiconductor material layer can be from $1.0 \times 10^{14}/cm^3$ to $1.0 \times 10^{17}/cm^3$, although lesser and greater dopant concentration can also be employed. An upper portion of the first semiconductor-device-containing layer 118 can include a lower level metal interconnect layer 116, which includes at least one dielectric material layer embedding metal interconnect structures such as metal vias and metal lines as well as a gate structure of a field effect transistor and/or an emitter structure of a bipolar transistor.

The first handle substrate 112 can be a semiconductor substrate including a semiconductor material or an insulator substrate including an insulator material. The first handle substrate 112 typically includes a material that can be removed from the second substantially planar surface 119, for example, by polishing, grinding, and/or an etch.

Figure 2:
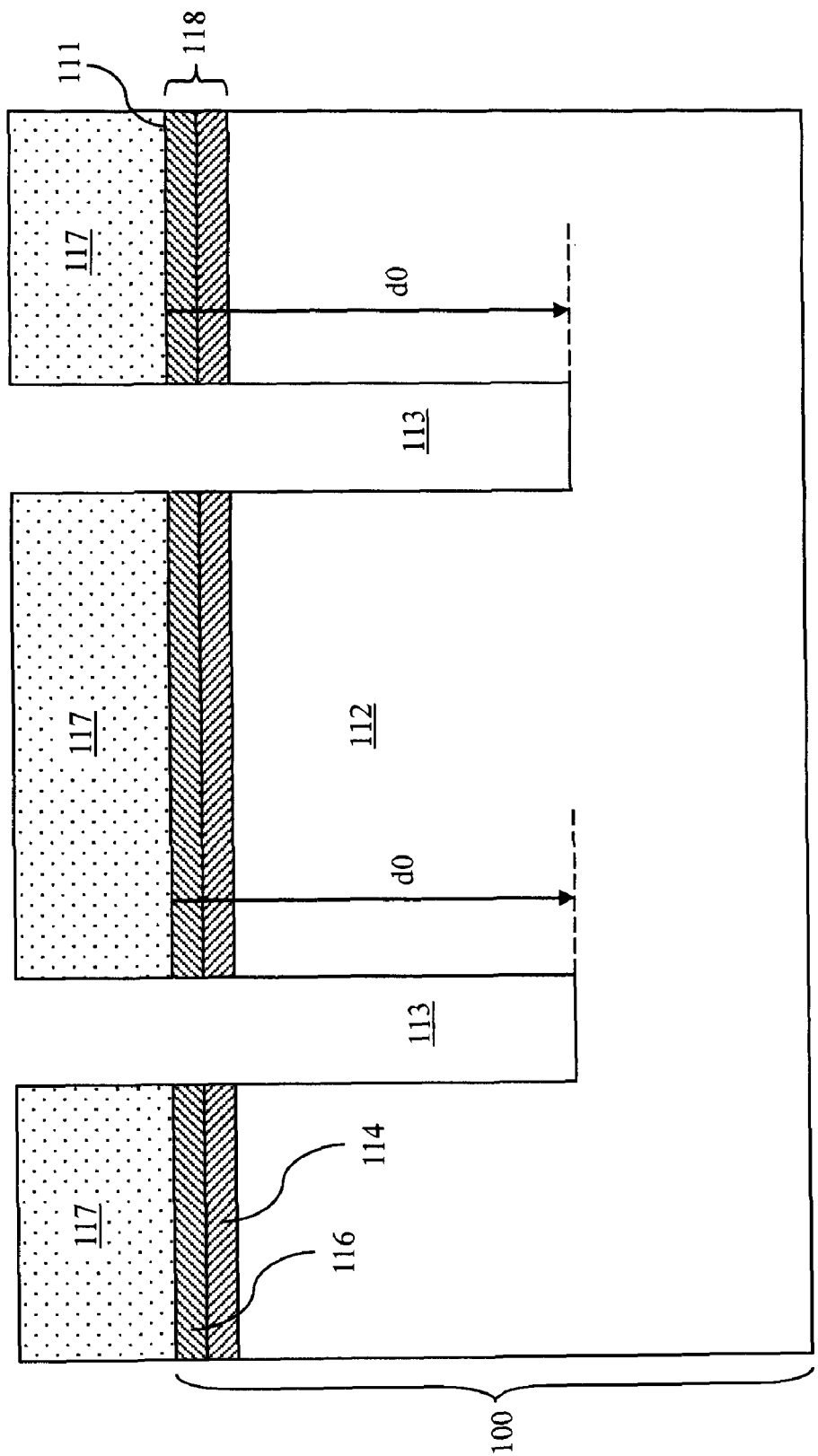
FIG. 2 is a vertical cross-sectional view of the first exemplary semiconductor structure after forming at least one trench in the first substrate according to the first embodiment of the present invention.

Referring to FIG. 2, a photoresist 117 is applied to the first substantially planar surface 111 and lithographically patterned to form at least one opening therein. Preferably, a plurality of openings is formed in the photoresist 117 by lithographic methods. The shape of each opening can be circular, oval, square, rectangular, or polygonal. The lateral dimensions of the shape of each opening in the photoresist 117 can be from about 0.3 microns to 100 microns, and typically from 1 micron to 10 microns, although lesser and greater dimensions can also be employed.

The pattern in the photoresist 117 can be transferred through the first semiconductor-device-containing layer 118 and into an upper portion of the first handle substrate by an anisotropic etch employing the photoresist 117 as an etch mask. At least one trench 113 extends from the first substantially planar surface 111 into the first substrate 100 after the anisotropic etch. The at least one trench 113 can have substantially vertical sidewalls. The at least one trench can be a plurality of trenches arranged as an array.

The depth d0 of the at least one trench 113 as measured from the first substantially planar surface 111 to a horizontal bottom surface of the at least one trench 113 can be substantially equal to the final thickness of the first substrate 100 after planarization to be subsequently performed. The depth d0 of the at least one trench 113 can be from 10 microns to 300 microns, and typically from 50 microns to 150 microns, although lesser and greater depths can also be employed. The photoresist 117 is subsequently removed, for example, by ashing.

Figure 3:
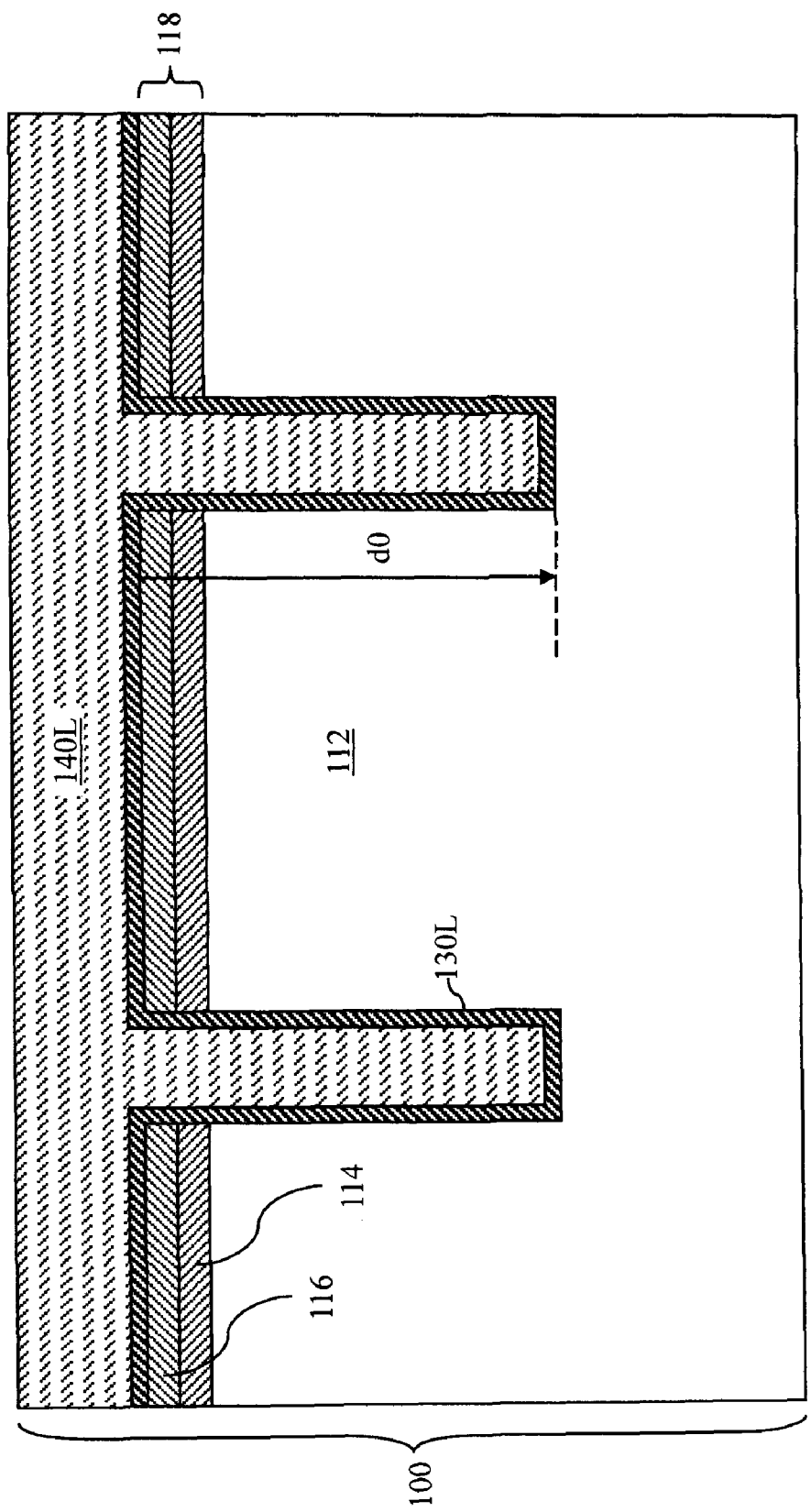
FIG. 3 is a vertical cross-sectional view of the first exemplary semiconductor structure after depositing a first conductive liner and a first conductive fill material layer according to the first embodiment of the present invention.

Referring to FIG. 3, a first conductive liner material is deposited on a bottom surface and sidewalls of each of the at least one trench 113, for example, by electroplating, electroless plating, chemical vapor deposition (CVD), and/or physical vapor deposition (PVD) to form a first conductive liner 130L. The first conductive liner 130L includes a single piece of a contiguous metallic material that prevents diffusion of conductive materials that are subsequently deposited thereupon. The first conductive liner 130L typically contacts the entirety of the bottom surfaces and sidewalls of the at least one trench 113. The first conductive liner 130L can be composed of an elemental transition metal, a nitride of an elemental transition metal, or an alloy thereof. For example, the first conductive liner 130L can be composed of a material selected from titanium (Ti), tantalum (Ta), ruthenium (Ru), tungsten (W), titanium-nitride (TiN), tantalum-nitride (TaN), ruthenium nitride (RuN), tungsten nitride (WN), and alloys thereof. In one embodiment, the first conductive liner 130L is substantially conformal, i.e., has the same thickness throughout. The thickness of the first conductive liner 130L can be from 1 nm to 60 nm, and typically from 3 nm to 20 nm, although lesser and greater thicknesses can also be employed.

A first conductive fill material is deposited on the first conductive liner 130L, for example, by electroplating, electroless plating, chemical vapor deposition (CVD), and/or physical vapor deposition (PVD) to form a first conductive fill material layer 140L. The first conductive fill material layer 140L includes a single piece of a contiguous metallic material having high electrical conductivity. The first conductive fill material layer 140L either completely or partially fills each of the remaining cavities in the at least one trench 113. The first conductive fill material layer 140L can be composed of an elemental metal, a nitride of an elemental metal, or an alloy thereof. For example, the first conductive fill material layer 140L can be composed of a material selected from tungsten (W), copper (Cu), aluminum (Al), silver (Ag), gold (Au), and alloy thereof.

The first conductive fill material and the first conductive liner material are selected such that the first conductive liner material prevents diffusion of the first conductive fill material therethrough. The depth d0 can exceed the Blech length of the first conductive fill material for projected maximum current density therethrough in a vertical direction.

Figure 4:
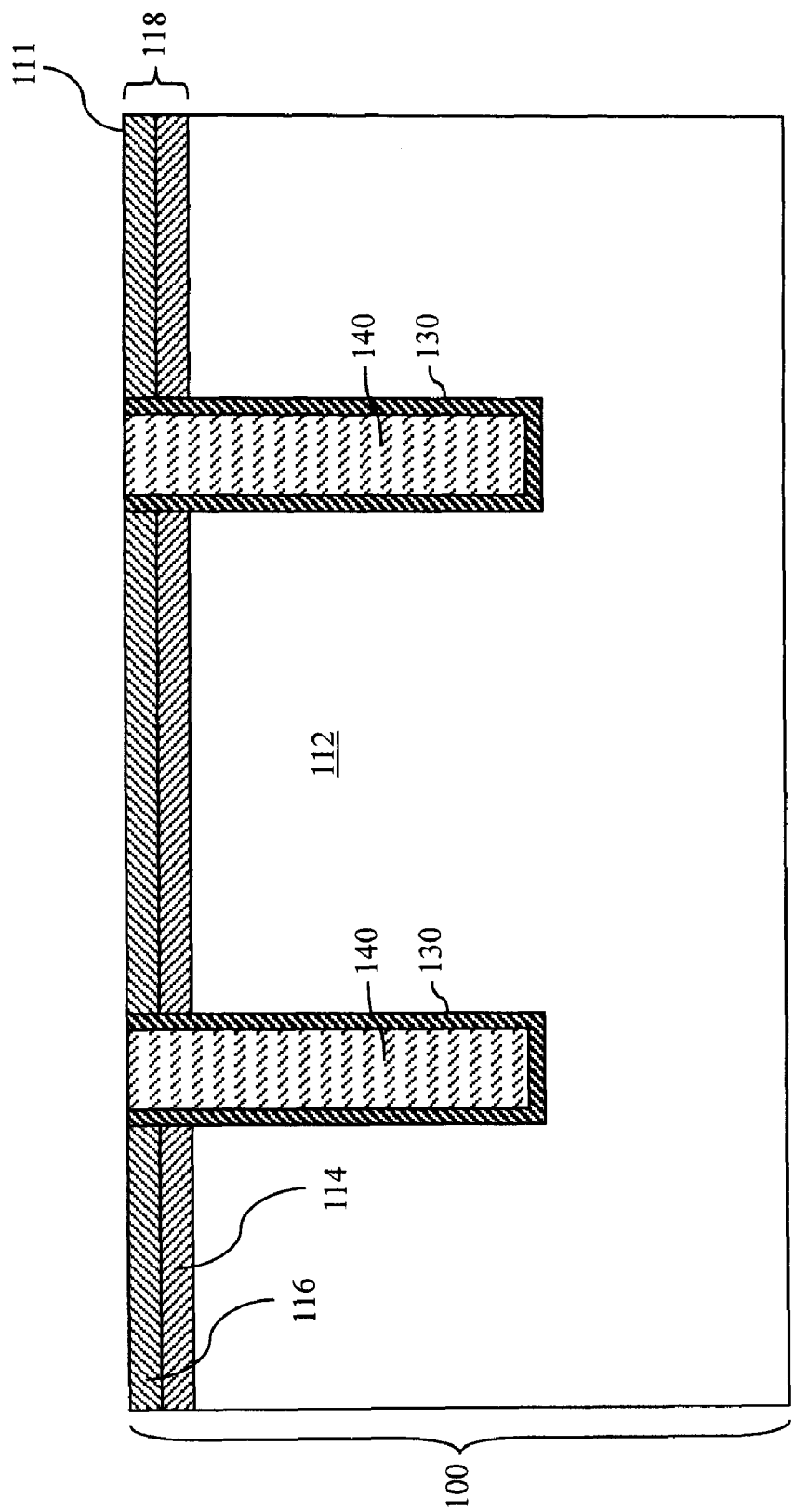
FIG. 4 is a vertical cross-sectional view of the first exemplary semiconductor structure after removing the first conductive liner and the conductive fill material layer from above a first surface of the first substrate according to the first embodiment of the present invention.

Referring to FIG. 4, the portions of the first conductive liner 130L from FIG. 3 and the first conductive fill material layer 140L from FIG. 3 are removed from above the first substantially planar surface 111 of the first substrate 100, for example, by chemical mechanical planarization (CMP), a recess etch, or a combination thereof. The first substantially planar surface 111 of the first substrate 100 is substantially coplanar with top surfaces of the remaining portions of the first conductive liner 130L and the first conductive fill material layer 140L in the case where the first conductive fill material layer 140L completely fills each of the remaining cavities in the at least one trench 113. If a plurality of trenches is present in the first substrate 100, each trench includes a first conductive liner portion 130 and a first conductive via fill portion 140, a portion of which becomes conductive via segment of a through-substrate via structure to be subsequently formed. Each first conductive liner portion 130 is a remaining portion of the first conductive liner 130L, and each first conductive via fill portion 140 is a remaining portion of the first conductive fill material layer 140L after the planarization.

Figure 5:
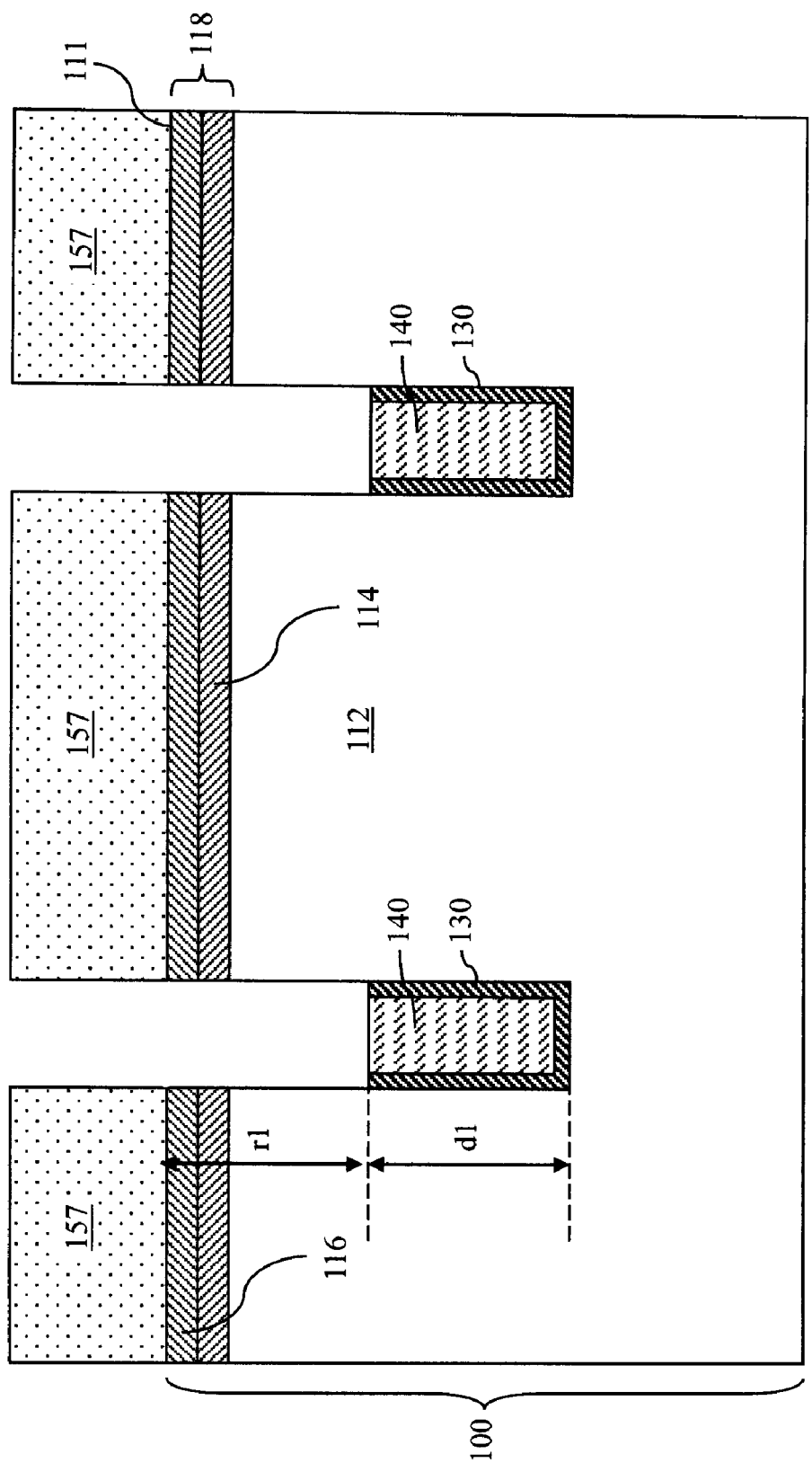
FIG. 5 is a vertical cross-sectional view of the first exemplary semiconductor structure after recessing the first conductive liner and at least one first conductive via fill portion from an upper portion of each of the at least one trench in the first substrate according to the first embodiment of the present invention.

Referring to FIG. 5, a second photoresist 157 is applied to the topmost surface of the first substrate 100 and is lithographically patterned to form openings above each of the at least one trench 113 from FIG. 2. The at least one first conductive via fill portion 140 and the at least one first conductive liner portion 130 are removed by a recess etch, either concurrently or consecutively, to a first recess depth r1 from the first substantially planar surface 111 from an upper portion of each of the at least one trench. In one case, the upper portion of a first conductive via fill portion 140 and an upper portion of a first conductive liner portion 130 are removed concurrently by a metal etch to the first recess depth r1 in each of the at least one trench. Alternately, an upper portion of a first conductive via fill portion 140 is removed selective to a first conductive liner portion 130 to the first recess depth r1 in each of the at least one trench, and exposed portions of the first conductive liner portion 130 can be subsequently removed by another metal etch.

The recess depth r1 is selected such that a first vertical distance d1 of the remaining portions of the first conductive liner portion 130 and the first conductive via fill portion 140 is less than the Blech length of the material of the first conductive via fill portion 140 at a projected maximum current density that the first conductive via fill portion 140 is expected to be subsequently subjected to.

Figure 6:
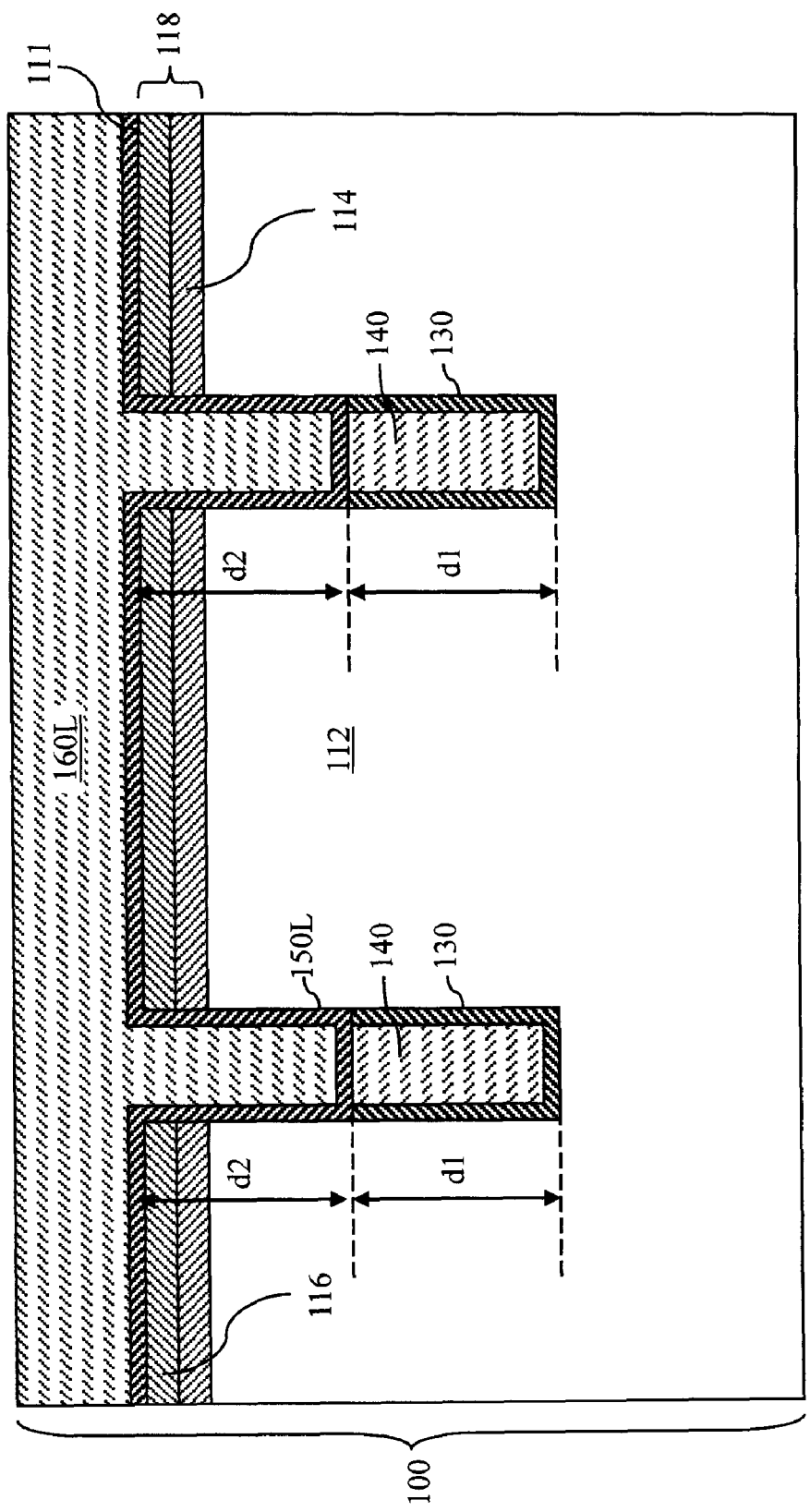
FIG. 6 is a vertical cross-sectional view of the first exemplary semiconductor structure after depositing a second conductive liner and a second conductive via fill portion according to the first embodiment of the present invention.

Referring to FIG. 6, a second conductive liner material is deposited on the topmost surfaces of each of the first conductive liner portion 130, the first conductive via fill portion 140, the first substantially planar surface 111, and exposed sidewalls of each of the at least one trench 113 from FIG. 2, for example, by electroplating, electroless plating, chemical vapor deposition (CVD), and/or physical vapor deposition (PVD) to form a second conductive liner 150L. The second conductive liner 150L includes a single piece of a contiguous metallic material that prevents diffusion of the material of the first conductive via fill portion 140 and additional conductive materials to be subsequently deposited thereupon. The second conductive liner 150L contacts the entirety of the topmost surfaces of the first conductive liner portion 130 and the first conductive via fill portion 140. The second conductive liner 150L can be composed of the material that can be employed for the first conductive liner 130L as described above. In one embodiment, the second conductive liner 150L is substantially conformal. The thickness of the second conductive liner 150L can be from 1 nm to 60 nm, and typically from 3 nm to 20 nm, although lesser and greater thicknesses can also be employed.

A second conductive fill material is deposited on the second conductive liner 150L, for example, by electroplating, electroless plating, chemical vapor deposition (CVD), and/or physical vapor deposition (PVD) to form a second conductive fill material layer 160L. The second conductive fill material layer 160L includes a single piece of a contiguous metallic material having high electrical conductivity. The second conductive fill material layer 160L completely fills each of the remaining cavities in the at least one trench. The second conductive fill material layer 160L can be composed of any material that can be employed for the first conductive fill material layer 140L as described above.

The second conductive liner material is selected such that the second conductive liner material prevents diffusion of the second conductive fill material and diffusion of the first conductive fill material of the first conductive via fill portion 140. The depth, as measured from the horizontal plane of the first substantially planar surface 111, of the interface(s) between a bottom surface of the second conductive liner 150L and the top surfaces of the first conductive liner portion 130 and the first conductive via fill portion 140 is herein referred to as a second vertical distance d2.

Figure 7:
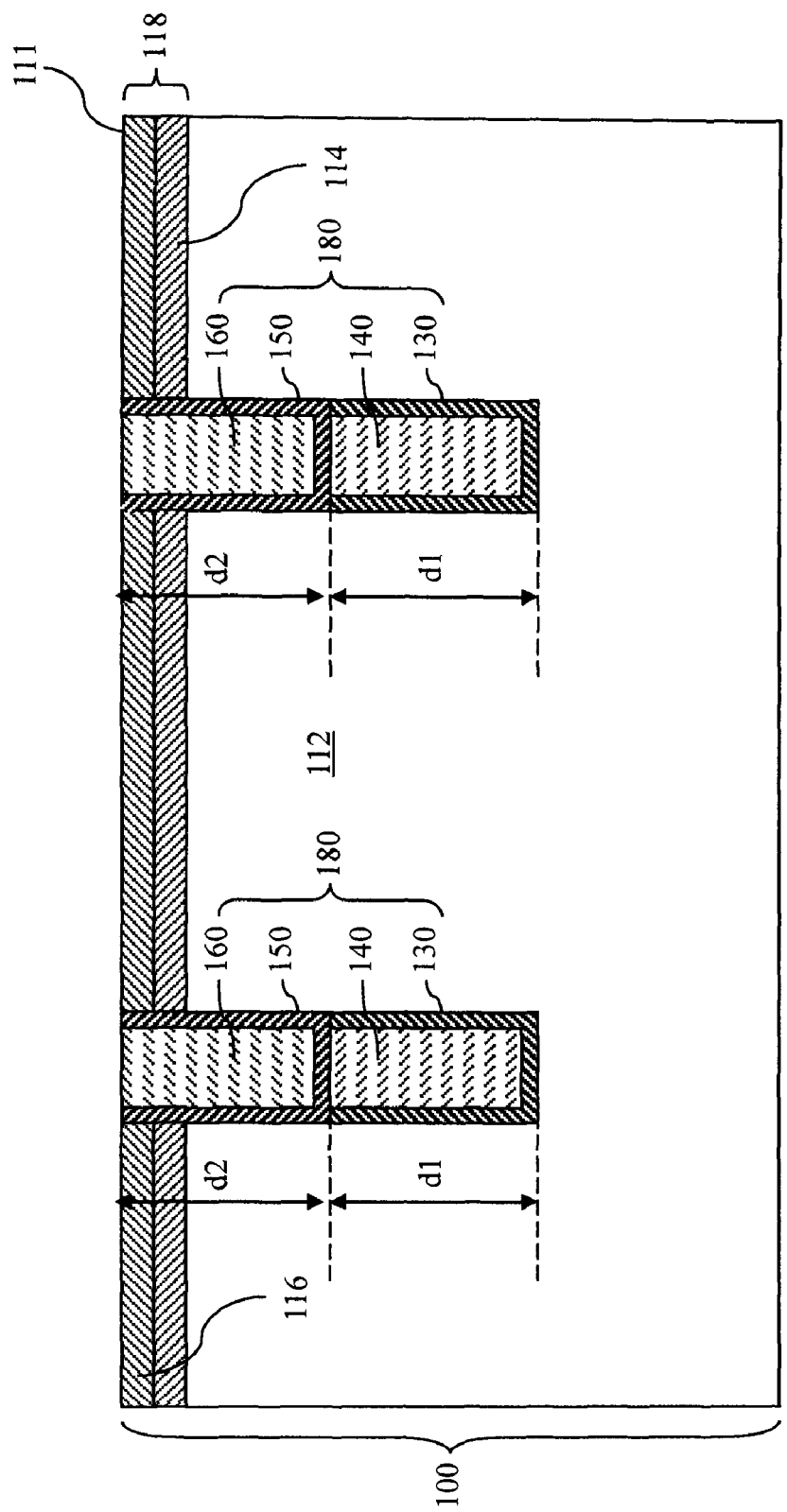
FIG. 7 is a vertical cross-sectional view of the first exemplary semiconductor structure after removing the second conductive liner and the second conductive via fill portion from above the first surface of the first substrate according to the first embodiment of the present invention.

Referring to FIG. 7, the portions of the second conductive liner 150L from FIG. 6 and the second conductive fill material layer 160L from FIG. 6 are removed from above the first substantially planar surface 111 of the first substrate 100, for example, by chemical mechanical planarization (CMP), a recess etch, or a combination thereof. The first substantially planar surface 111 of the first substrate 100 is substantially coplanar with top surfaces of the remaining portions of the second conductive liner 150L and the second conductive fill material layer 160L. If a plurality of trenches is present in the first substrate 100, each trench includes a first conductive liner portion 130, a first conductive via fill portion 140, a second conductive liner portion 150, and a second conductive via fill portion 160. Each second conductive liner portion 150 is a remaining portion of the second conductive liner 150L, and each second conductive via fill portion 160 is a remaining portion of the second conductive fill material layer 160L after the planarization.

If the second vertical distance d2 is less than the Blech length of the material of the second conductive via fill portion 160 at the projected maximum current density that the second conductive via fill portion 160 is expected to be subsequently subjected to, each set of a first conductive liner portion 130, a first conductive via fill portion 140, a second conductive liner portion 150, and a second conductive via fill portion 160 within a trench constitutes a through-substrate via (TSV) structure 180. The first conductive via fill portion 130 is a first conductive via segment in each of the at least one TSV structure 180, and the second conductive via fill portion 150 is a second conductive via segment in each of the at least one TSV structure 180. Each of the at least one TSV structure 180 extends from the first substantially planar surface 111 through the first semiconductor-device-containing layer 118 and into an upper portion of the first substrate 100.

If the second vertical distance d2 is greater than the Blech length of the material of the second conductive via fill portion 160 at the projected maximum current density that the second conductive via fill portion 160 is expected to be subsequently subjected to, the processing steps of FIGS. 5-7 are repeatedly performed (N−1) more times until a TSV structure 180 is formed in each of the at least one trench to form a number (N+1) of vertically stacked set of a conductive liner portion and a conductive via fill portion embedded therein. N is an integer greater than 1. The vertical distance between a topmost surface and a bottommost surface of each set of a conductive liner portion and a conductive via fill portion embedded therein is less than the Blech length of the material of the conductive via fill portion of that set.

In general, a set of processing steps corresponding to FIGS. 5-7 can be employed to form each set of a conductive liner portion and a conductive via fill portion embedded therein. The set of processing steps typically includes recessing a portion of a material that fills each upper portion of the at least one trench, depositing a conductive liner material on exposed sidewalls of each of the at least one trench, and depositing a conductive via segment material in each of the at least one trench. The conductive liner material can be any material that can be employed for the first conductive liner portion 130. The conductive via segment material can be any material that can be employed for the first conductive via fill portion 140. Each remaining portion of a deposited and recessed conductive liner material constitutes a conductive liner portion that is structurally equivalent to the second conductive liner portion 150. Each remaining portion of a deposited and receded conductive via segment material constitutes a conductive via segment, which is a conductive via fill portion that is structurally equivalent to the second conductive via fill portion 160 and embedded within one of the conductive liner portions. Each conductive via segment within one of the at least one TSV structure 180 has a vertical length that is less than the Blech length thereof for a maximum current density that the one of the at least one TSV structure 180 is configured to flow within the first substrate 100.

A Blech length, or $L_{Blech}$, of a conductive material is generally determined by the equation of $L_{Blech}=(jL)_{th}/j$, wherein $(jL)_{th}$ is the Blech threshold of the conductive material, and j is a current density passing through the conductive material in a direction where the Blech length is measured. For most conductive materials including Cu, Au, Ag, and Al, $(jL)_{th}$ is a constant known in the art. For example, the Blech threshold $(jL)_{th}$ is typically around 200 milliamp per micrometer (mA/μm) for copper. The current density can be measured, for example, in a unit of milliamp per micrometer square (mA/μm$^2$). Therefore, for a current density of for example 20 mA/μm$^2$ passing vertically through a TSV segment consisting essentially of copper, the Blech length may typically be found around 10 micrometers (μm).

The first conductive via fill portion 140, the second conductive via fill portion 160, and the conductive via segment (s), if present, can be the same conductive material. In this case, the Blech lengths for each of the first conductive via fill portion 140, the second conductive via fill portion 160, and the conductive via segment(s), if present, are the same, and can be determined by circuit design of the semiconductor chip that is manufactured in the first substrate 100.

Specifically, the Blech length for each TSV structure 180 can be calculated by employing the following steps:
(1) determining a cross-sectional area per through-substrate via from a design of a semiconductor chip that is manufactured in the first substrate 100 for each of the at least one TSV structure 180,
(2) determining a maximum current from the design for each of the at least one TSV structure 180, and
(3) determining the Blech length for each of the at least one TSV structure 180, wherein the Blech length is determined by $L_{Blech}=A_{TSV}\times(jL)_{th}/I_{TSV}$, wherein $L_{Blech}$ is the Blech length, $A_{TSV}$ is the cross-sectional area of the applicable TSV structure 180, $(jL)_{th}$ is a critical current density-length product for a material constituting the plurality of conductive via segments with the applicable TSV structure 180, and $I_{TSV}$ is the maximum current rated for the applicable TSV structure 180.

Because each of the at least one trench 113 (See FIG. 2) has a substantially same depth d0, the minimal number of repetitions for performing of the set of processing steps can be determined. Specifically, min($L_{Blech}$), i.e., the minimum of all $L_{Blech}$, is determined by comparing the numbers for $L_{Blech}$ among all of the at least one TSV structures 180 and selecting the smallest number among them. Then, d0/min($L_{Blech}$) is calculated. If d0/min($L_{Blech}$) is an integer, the integer N that satisfies the equation (N+1)=d0/min($L_{Blech}$) is the minimal number of repetitions for performing of the set of processing steps. If d0/min($L_{Blech}$) is not an integer, the value of d0/min ($L_{Blech}$) is rounded up to the next nearest integer, which is herein referred to INT {d0/min($L_{Blech}$)}. The integer N that satisfies the equation (N+1)=INT {d0/min($L_{Blech}$)} is the minimal number of repetitions for performing of the set of processing steps. Once the smallest integer (N+1) that is equal to or greater than d0/min($L_{Blech}$) is determined, the integer N is the minimal number of repetitions for performing of the set of processing steps can be determined. In general, each of the first conductive via fill portion 140, the second conductive via fill portion 160, and the conductive via segment(s), if present, has a vertical length that is less than the min($L_{Blech}$) of all of the at least one TSV structures 180.

The first conductive liner portion 130 and the first conductive via fill portion 140 collectively constitute a first TSV segment (130, 140). The second conductive liner portion 150 and the second conductive via fill portion 160 collectively constitute a second TSV segment (150, 160). Likewise, each pair of conductive liner portion and a conductive via segment embedded therein, if present, constitutes an i-th TSV segment, wherein i is an integer greater than 2 and is less than M, wherein M is the total number of TSV segments in each of the at least one TSV structure 180. Each of the first, second, and i-th TSV segment has a vertical dimension (or height) that is smaller than a Blech length of electromigration for the material of the corresponding conductive via segment.

Figure 8:
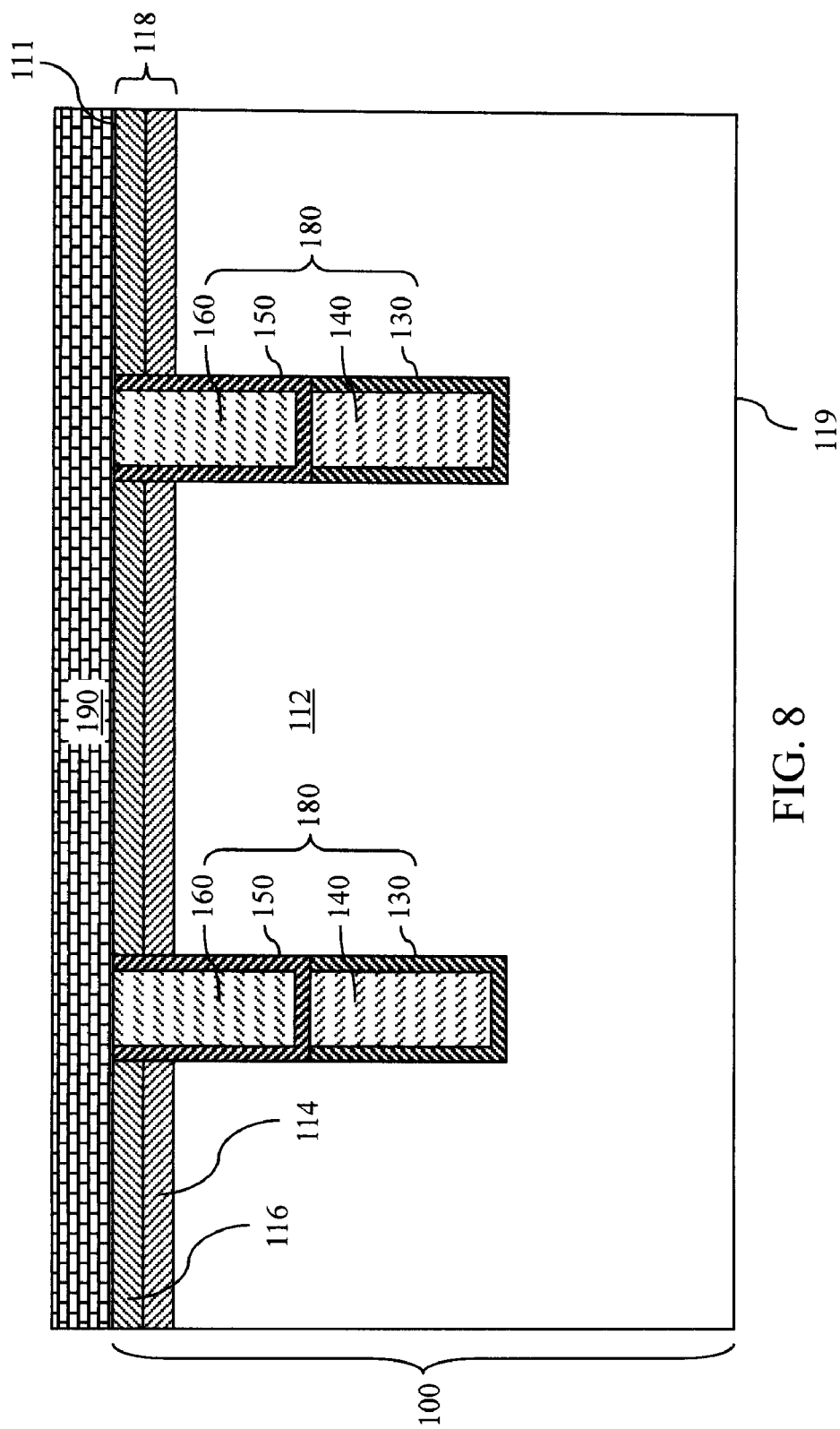
FIG. 8 is a vertical cross-sectional view of the first exemplary semiconductor structure after formation of a back-end-of-line metal interconnect layer according to the first embodiment of the present invention.

Referring to FIG. 8, a first back-end-of-line (BEOL) metal interconnect layer 190 is formed on the first substantially planar surface 111 of the first substrate 100. The first BEOL metal interconnect layer 190 typically includes at least one dielectric material layer and at least one metal interconnect structure embedded therein. The at least one metal interconnect structure can provide electrical connection between the at least one semiconductor device embedded in the first semiconductor-device-containing layer 118 and the at least one TSV structure 180 by providing a conductive path therebetween. The at least one metal interconnect structure embedded in the first BEOL metal interconnect layer 190 can include metal lines that provide conductive paths in horizontal directions, i.e., in directions parallel to the first substantially planar surface 111, and metal vias that provide conductive paths in the vertical direction, i.e., in the direction perpendicular to the first substantially planar surface 111.

Figure 9:
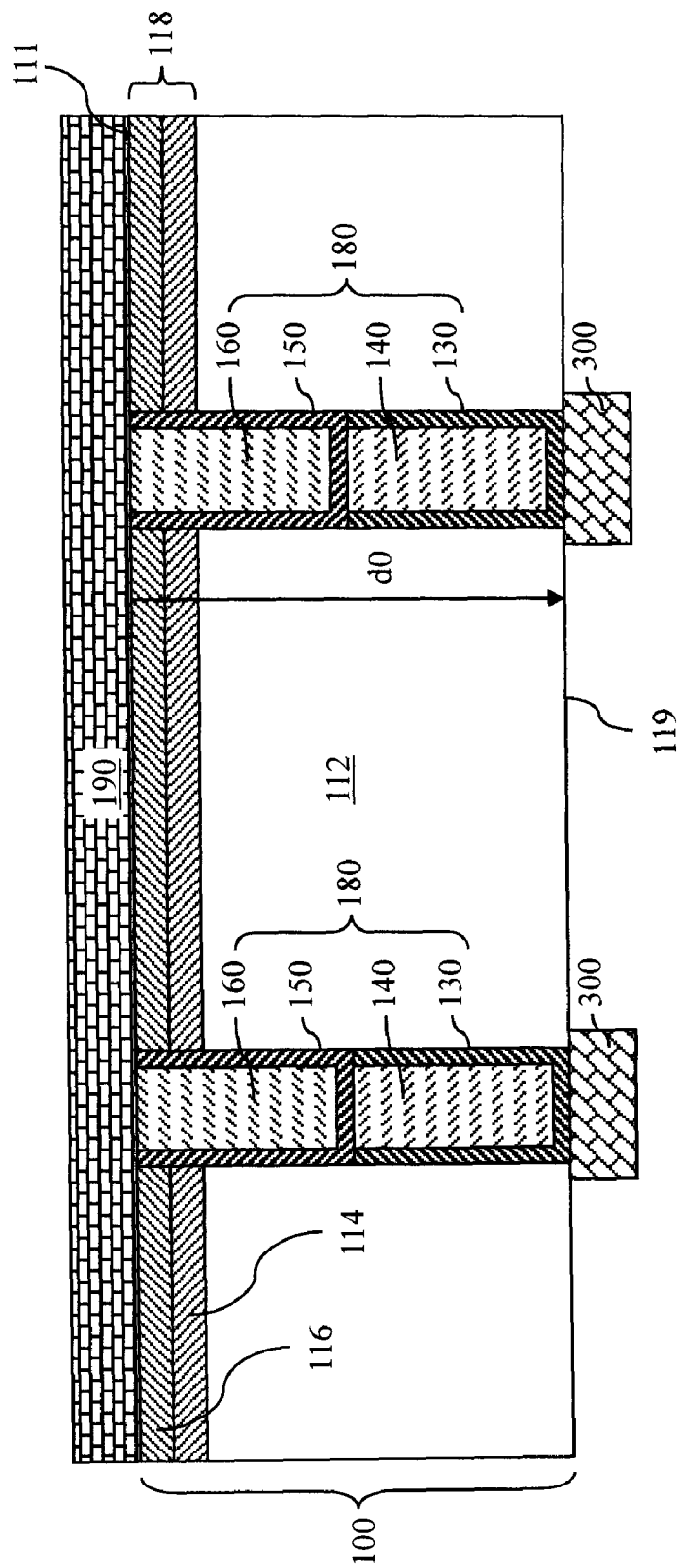
FIG. 9 is a vertical cross-sectional view of the first exemplary semiconductor structure after formation of an array of conductive bonding material portions on a second surface of the first substrate according to the first embodiment of the present invention.

Referring to FIG. 9, the first substrate 100 can be thinned from the bottom. Specifically, a lower portion of the first substrate 100 can be removed from the second substantially planar surface 119 of the first substrate 100, for example, by polishing or grinding of the material of the first substrate 100 until the at least one TSV structure 180 is exposed. The first TSV segment (130, 140) of the at least one TSV structure 180 is exposed on the second substantially planar surface 119, which moves closer to the first substantially planar surface 111 during the thinning process. The vertical distance between the first substantially planar surface 111 and the second substantially planar surface 119 can be substantially the same as the depth d0 of the at least one trench 113 at the processing step of FIG. 2.

Each TSV structure 180 extends from the first substantially planar surface 111 located on one side of the first substrate 100 to the second substantially planar surface 119 located on the opposite side of the first substrate 100. Each of the at least one TSV structure 180 includes a plurality of conductive via segments (140, 160) that are vertically spaced from one another by at least one conductive liner portion such as the second conductive liner portion 150. The at least one TSV structure 180 can be an array of TSV structures, which can be arranged as a one-dimensional array, i.e., a linear array, or a two-dimensional array.

Each vertically adjacent pair of the plurality of conductive via segments (140, 160) is spaced from each other by a conductive liner portion, e.g., the second conductive liner portion 150, among the at least one conductive liner portion (130, 150). The bottom surface of one of the vertically adjacent pair of conductive via segments is in contact with an upper surface of the conductive liner portion, and a top surface of the other of the vertically adjacent pair of conductive via segments is in contact with a lower surface of the conductive liner portion. For example, the bottom surface of the second conductive via fill portion 160, which is a second conductive via segment, is in contact with an upper surface of the second conductive liner portion 150, and a top surface of the first conductive via fill portion 140, which is a first conductive via segment, is in contact with a lower surface of the second conductive liner portion 150.

Further, such a conductive liner portion extends upward from a periphery of the upper surface and laterally surrounds, and contacts sidewalls of, the one of the vertically adjacent pair of conductive via segments. For example, the second conductive liner portion 150 extends upward from a periphery of the upper surface of the second conductive liner portion 150 and laterally surrounds, and contacts sidewalls of, the second conductive via fill portion 160, which is the second conductive via segment.

The lower surface of the conductive liner portion is in contact with another conductive liner portion that laterally surrounds, and contacts sidewalls of, the other of the vertically adjacent pair of conductive via segments. For example, the lower surface of the second conductive liner portion 150 is in contact with the first conductive liner portion 130 that laterally surrounds, and contacts sidewalls of, the first conductive via fill portion 140, which is the first conductive via segment.

As discussed above, each conductive via segment, such as the first and second conductive via fill portions (140, 160), within one of the at least one TSV structure 180 has a vertical length that is less than any Blech length for the maximum current density that the each of the at least one TSV structure 180 is configured to flow within the first substrate 100 in the vertical direction between the first substantially planar surface 111 and the second substantially planar surface 119.

If the at least one TSV structure 180 is an array of TSV structures 180, an array of conductive bonding material portions 300 can be formed on the second substantially planar surface 119 of the first substrate 100. The array of conductive bonding material structures 300 is located directly on the second substantially planar surface 119 of the first substrate 100. Each of the array of conductive bonding material structures 300 contacts a bottom surface of a TSV structure 180 within the array of TSV structures.

The array of conductive bonding material structures 300 can be a bonding layer including an array of C4 balls, which are solder balls that can be reflowed for the purposes of bonding. Alternately, the array of conductive bonding material structures 300 can be a bonding layer including an array of conductive bonding pads that are formed by patterning a metal layer of a constant thickness into isolated shapes, each underlying one of the at least one TSV structure 180.

Figure 10:
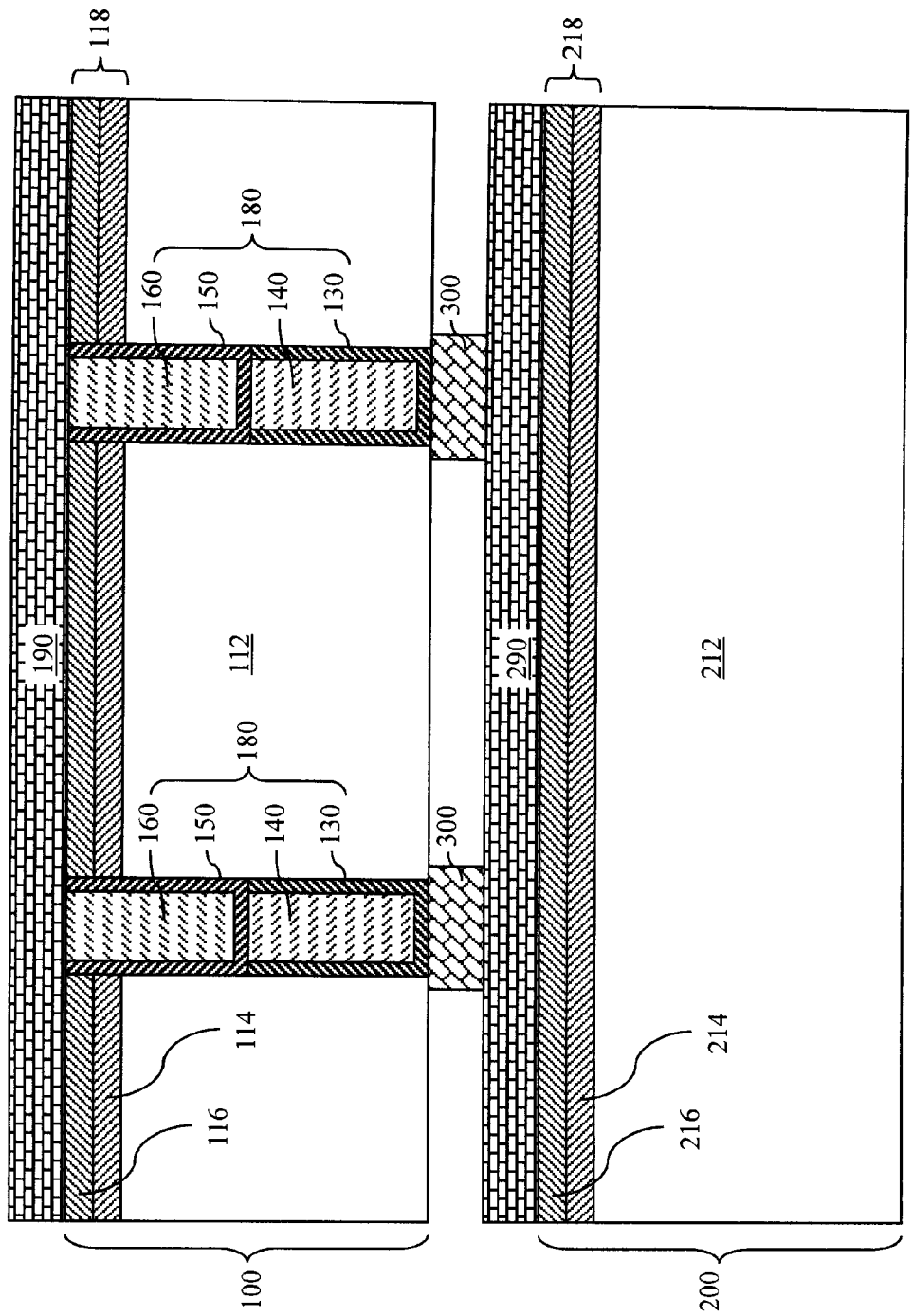
FIG. 10 is a vertical cross-sectional view of the first exemplary semiconductor structure after bonding a second substrate to the first substrate through the array of conductive bonding material portions according to the first embodiment of the present invention.

Referring to FIG. 10, a mounting structure is bonded to the array of conductive bonding material structures 300. The mounting structure can be an assembly of a second substrate 200 and a second BEOL metal interconnect layer 290 located thereupon. The array of conductive bonding material structures 300 provides a plurality of electrical connections between the at least one semiconductor device in the first semiconductor-device-containing layer 118 and the conductive structures located in the second substrate 200 and the second BEOL metal interconnect layer 290 to provide three-dimensional chip integration.

The second substrate 200 can include a second handle substrate 212 and a second semiconductor-device-containing layer 218 that typically includes at least another semiconductor device. The second semiconductor-device-containing layer 218 can include semiconductor devices for another semiconductor chip. The thickness of the second substrate 200 is typically from 100 microns to 1,000 microns, although lesser and greater thicknesses can also be employed.

A lower portion of the second semiconductor-device-containing layer 218 can include a second semiconductor material layer 214. The second semiconductor material layer 214 can be any semiconductor material that can be used for the semiconductor material layer 114 in the first substrate 100. The second semiconductor material layer 214 can include a single crystalline material. An upper portion of the second semiconductor-device-containing layer 218 can include a second lower level metal interconnect layer 216, which includes at least one dielectric material layer embedding metal interconnect structures such as metal vias and metal lines as well as a gate structure of a field effect transistor and/or an emitter structure of a bipolar transistor.

The second BEOL metal interconnect layer 290 typically includes at least one dielectric material layer and at least one metal interconnect structure embedded therein. The at least one metal interconnect structure can provide electrical connection between the at least another semiconductor device embedded in the second semiconductor-device-containing layer 218 and the array of conductive bonding material structures 300 by providing a conductive path therebetween. The at least one metal interconnect structure embedded in the second BEOL metal interconnect layer 290 can include metal lines that provide conductive paths in horizontal directions and metal vias that provide conductive paths in the vertical direction.

Figure 11:
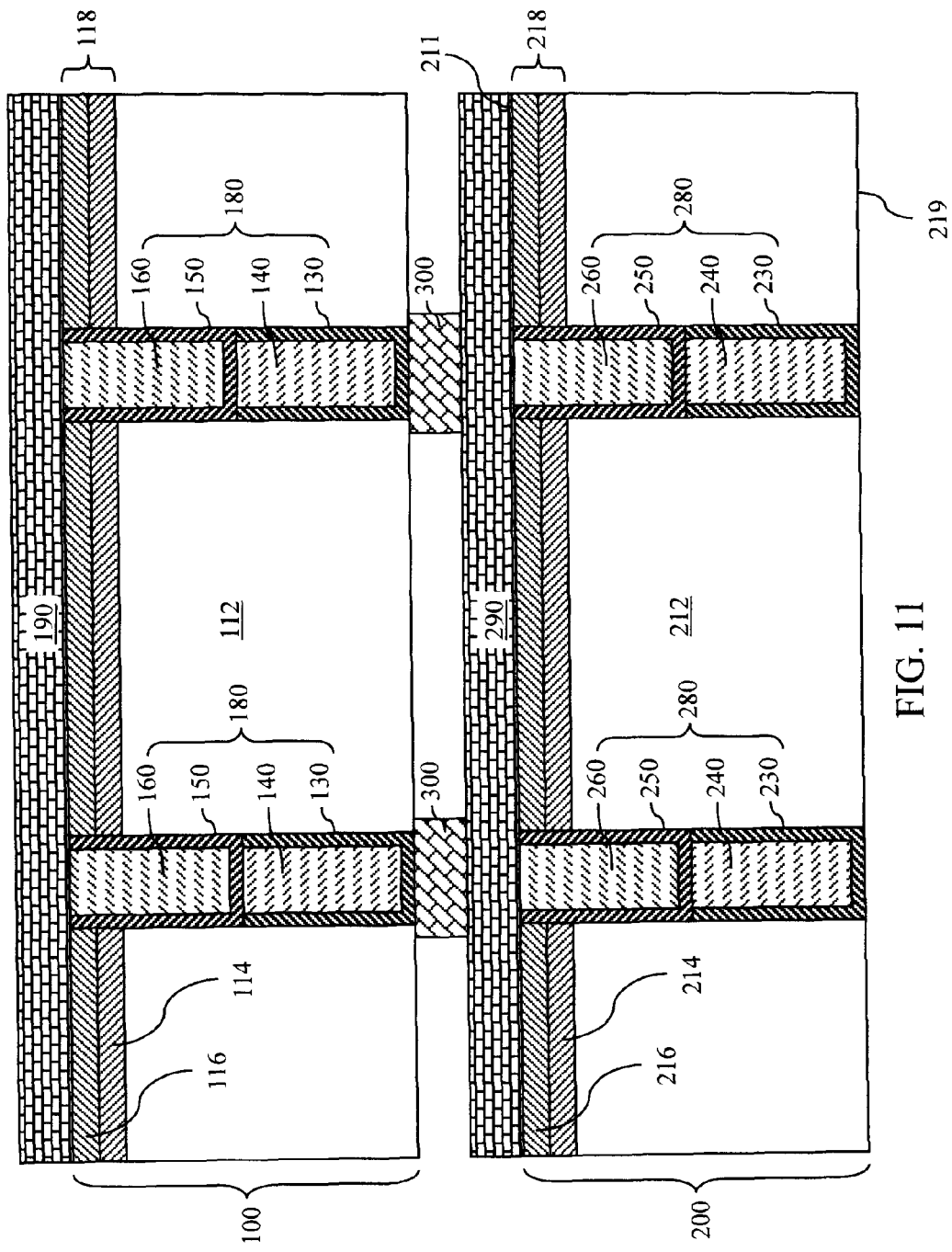
FIG. 11 is a vertical cross-sectional view of a second exemplary semiconductor structure after bonding a second substrate to the first substrate through the array of conductive bonding material portions according to a second embodiment of the present invention.

Referring to FIG. 11, a second exemplary semiconductor structure according to a second embodiment of the present invention is derived from the first exemplary semiconductor structure by employing a second substrate 200 including at least another TSV structure 280, which can be a second plurality of TSV structures. The second plurality of TSV structures 280 in the second substrate 200 can be formed employing the same processing steps as illustrated in FIGS. 2-9. Each of the at least another TSV structure 280 extends from the third substantially planar surface 211 to a fourth substantially planar surface 219 that are located on opposite sides second substrate 200. Each of the at least another TSV structure 280 includes another plurality of conductive via segments that are vertically spaced from one another by at least another conductive liner portion. The at least another TSV structure 280 in the second substrate 200 is formed before forming the second BEOL metal interconnect layer 290 and bonding of the first substrate 100 to the assembly of the second substrate 200 and the second BEOL metal interconnect layer 290 through the array of conductive bonding material structures 300.

Another array of conductive bonding material structures (not shown) can be formed on the fourth substantially planar surface 219 to enable additional vertical electrical connection with another mounting structure (not shown).

Figure 12:
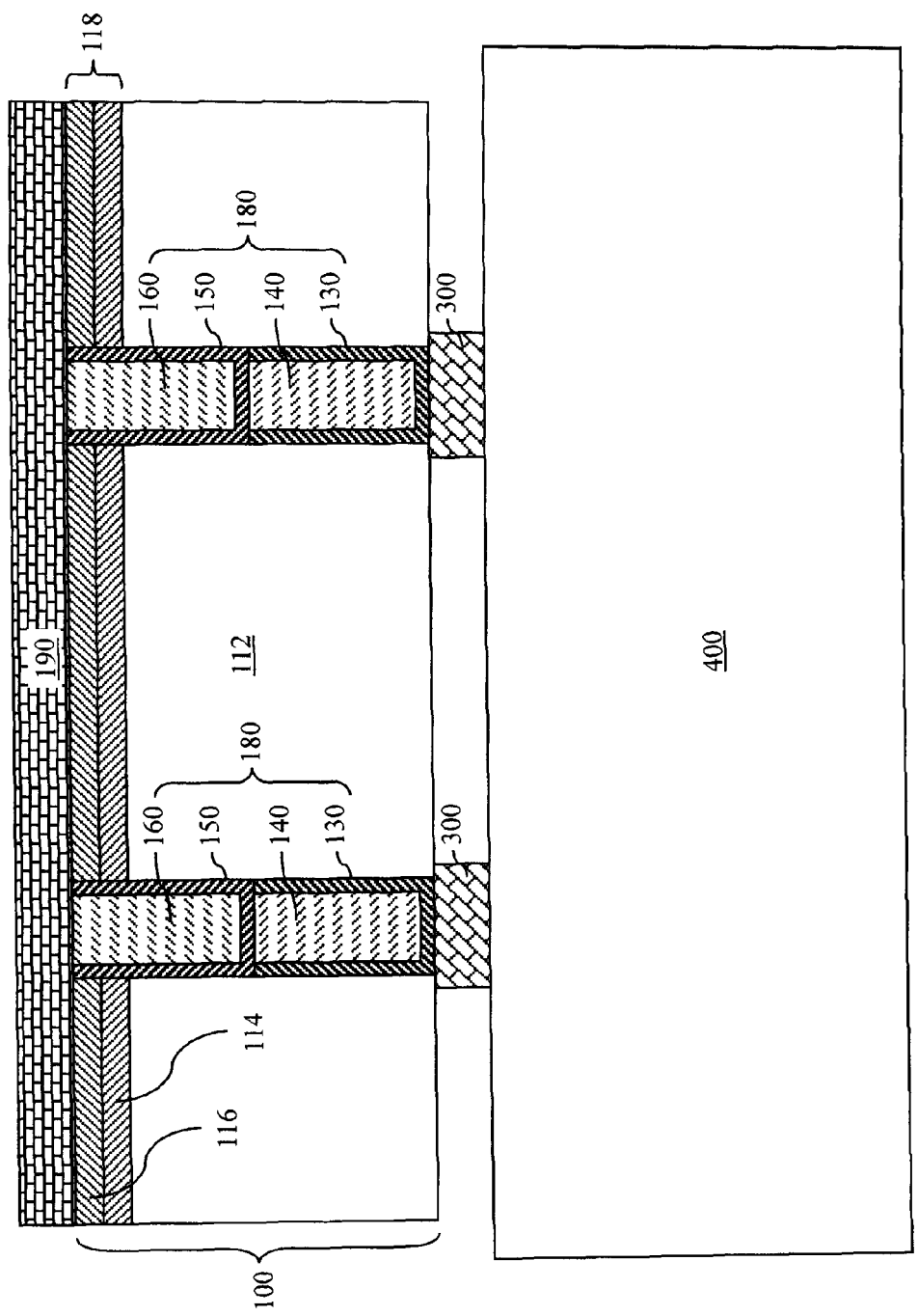
FIG. 12 is a vertical cross-sectional view of a third exemplary semiconductor structure after bonding a packaging substrate to the first substrate through the array of conductive bonding material portions according to a third embodiment of the present invention.

Referring to FIG. 12, a third exemplary semiconductor structure according to a third embodiment of the present invention is derived from the first exemplary semiconductor structure by employing a packaging substrate 400 instead of a second substrate 200. The packaging substrate 400 can be a ceramic substrate or a laminar substrate comprising a dielectric material.

The array of conductive bonding material structures 300 provides a plurality of electrical connections between the at least one semiconductor device in the first semiconductor-device-containing layer 118 and the conductive structures located in the packaging substrate 400 to provide three-dimensional chip integration.

Further, any mounting structure can be employed instead of a second substrate 200 or a packaging substrate to provide a three-dimensional integration of semiconductor chips as needed. Because the length of each conductive via segment does not exceed the Blech length, each of the at least one TSV structure 180 and the at least another TSV structure (see FIG. 11) is immune to electromigration. By eliminating electromigration from failure mechanisms of the at least one TSV structure 180 and the at least another TSV structure, the reliability of three dimensional integrated chips is increased significantly.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A semiconductor structure comprising:
a first substrate, said first substrate including at least one through-substrate via (TSV) structure extending from a first surface located on one side of said first substrate to a second surface located on an opposite side of said first substrate, each of said at least one TSV structure comprising a plurality of conductive via segments that are vertically spaced from one another by at least one conductive liner portion; and
an array of conductive bonding material structures located on said second surface of said first substrate, wherein each of said array of conductive bonding material structures contacts a bottom surface of a TSV structure within said at least one TSV structure, wherein each vertically adjacent pair of said plurality of conductive via segments is spaced from each other by a conductive liner portion among said at least one conductive liner portion, wherein a bottom surface of one of said vertically adjacent pair of conductive via segments is in contact with an upper surface of said conductive liner portion and a top surface of the other of said vertically adjacent pair of conductive via segments is in contact with a lower surface of said conductive liner portion, and wherein said lower surface of said conductive liner portion is in contact with another conductive liner portion that laterally surrounds, and contacts sidewalls of, said other of said vertically adjacent pair of conductive via segments.

2. The semiconductor structure of claim 1, wherein said at least one TSV structure is an array of TSV structures.

3. The semiconductor structure of claim 1, wherein said conductive liner portion extends upward from a periphery of said upper surface and laterally surrounds, and contacts sidewalls of, said one of said vertically adjacent pair of conductive via segments.

4. The semiconductor structure of claim 1, wherein each conductive via segment within one of said at least one TSV structure has a vertical length that is less than Blech length thereof for a maximum current density that said one of said at least one TSV structure is configured to flow within said first substrate in a vertical direction between said first surface and said second surface.

5. The semiconductor structure of claim 2, wherein said array of conductive bonding material structures is an array of C4 balls or an array of conductive bonding pads.

6. The semiconductor structure of claim 2, further comprising a second substrate bonded to said first substrate through said array of conductive bonding material, wherein said array of TSV structures and said array of conductive bonding material structures provide a plurality of electrical connections between at least one semiconductor device on said first surface of said first substrate and conductive structures located within said second substrate.

7. The semiconductor structure of claim 2, further comprising a packaging substrate bonded to said first substrate through said array of conductive bonding material, wherein said array of TSV structures and said array of conductive bonding material structures provide a plurality of electrical connections between at least one semiconductor device located on said first surface of said first substrate and conductive structures located within said packaging substrate.

8. The semiconductor structure of claim 6, wherein said second substrate includes at least another through-substrate via (TSV) structure extending from a third surface located on one side of said second substrate to a fourth surface located on an opposite side of said third surface, each of said at least another TSV structure comprising another plurality of conductive via segments that are vertically spaced from one another by at least another conductive liner portion.

* * * * *